(12) United States Patent
Kundracik

(10) Patent No.: US 7,169,018 B2
(45) Date of Patent: Jan. 30, 2007

(54) WAFER CARRIER CHECKER AND METHOD OF USING SAME

(75) Inventor: Michael John Kundracik, Boulder Creek, CA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 11/121,367

(22) Filed: May 4, 2005

(65) Prior Publication Data
US 2006/0252351 A1    Nov. 9, 2006

(51) Int. Cl.
*B24B 49/00*    (2006.01)
(52) U.S. Cl. .......................... 451/8; 451/442; 451/559
(58) Field of Classification Search .................. 451/8, 451/442, 559, 914; 73/865.8; 33/608, 645
See application file for complete search history.

(56) References Cited

U.S. PATENT DOCUMENTS

| | | | | |
|---|---|---|---|---|
| 5,485,759 A | * | 1/1996 | Goff et al. | 73/865.9 |
| 5,929,766 A | * | 7/1999 | Rochet et al. | 340/686.2 |
| 5,970,807 A | * | 10/1999 | Hsu et al. | 73/865.9 |
| 6,619,930 B1 | | 9/2003 | Jansen et al. | |
| 6,635,197 B1 | | 10/2003 | Cortum et al. | |

\* cited by examiner

*Primary Examiner*—Dung Van Nguyen
(74) *Attorney, Agent, or Firm*—Dorsey & Whitney LLP

(57) ABSTRACT

A tool and method for assessing whether a disk carrier, and especially a carrier for holding semiconductor disks, is properly dimensioned. The tool has a body that includes a socket in which a portion of the disk carrier will seat fully if the disk carrier is properly dimensioned. Alignment structures may be provided in the socket to align with features of the carrier to assist in determining whether the disk carrier is properly dimensioned. The socket may include two spaced apart cavities that correspond with end portions of walls of the disk carrier.

21 Claims, 7 Drawing Sheets

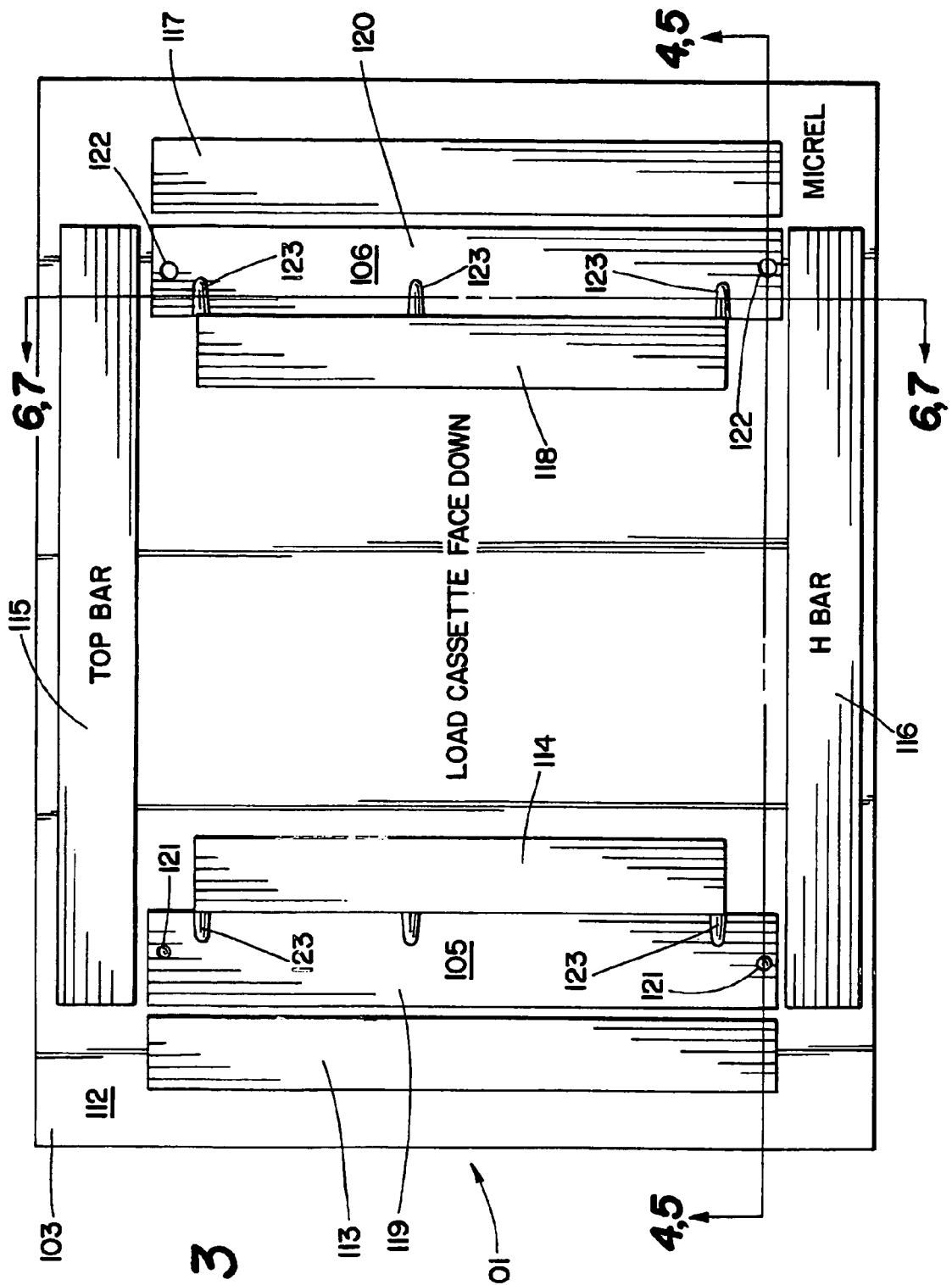

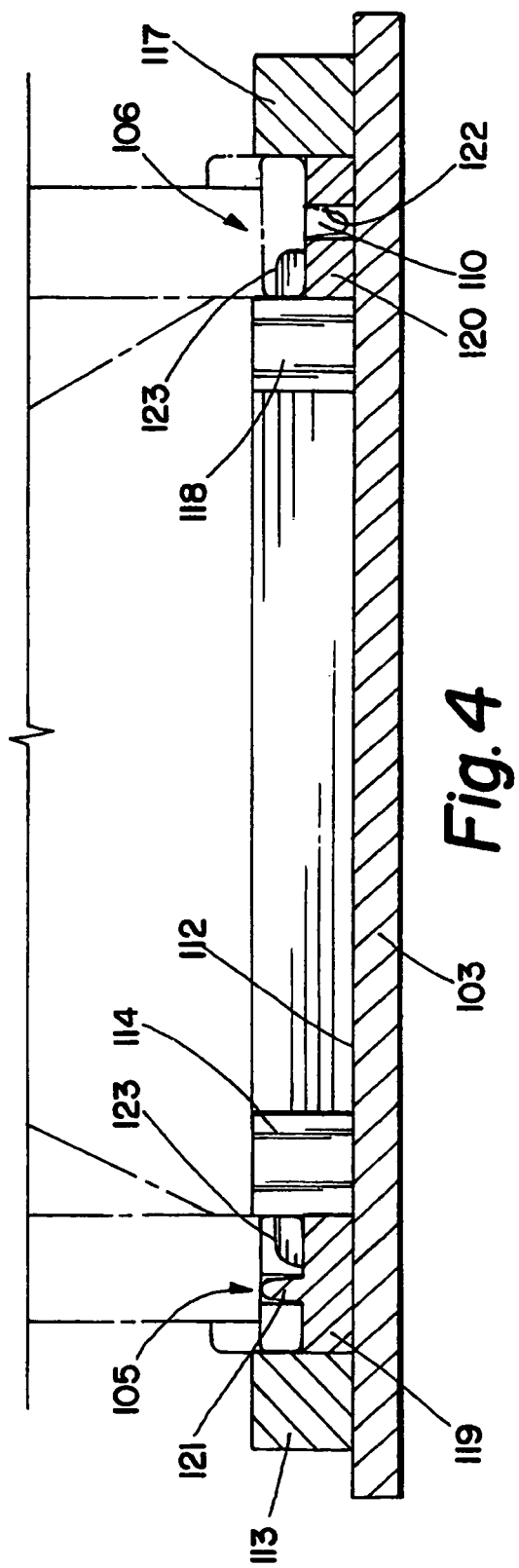
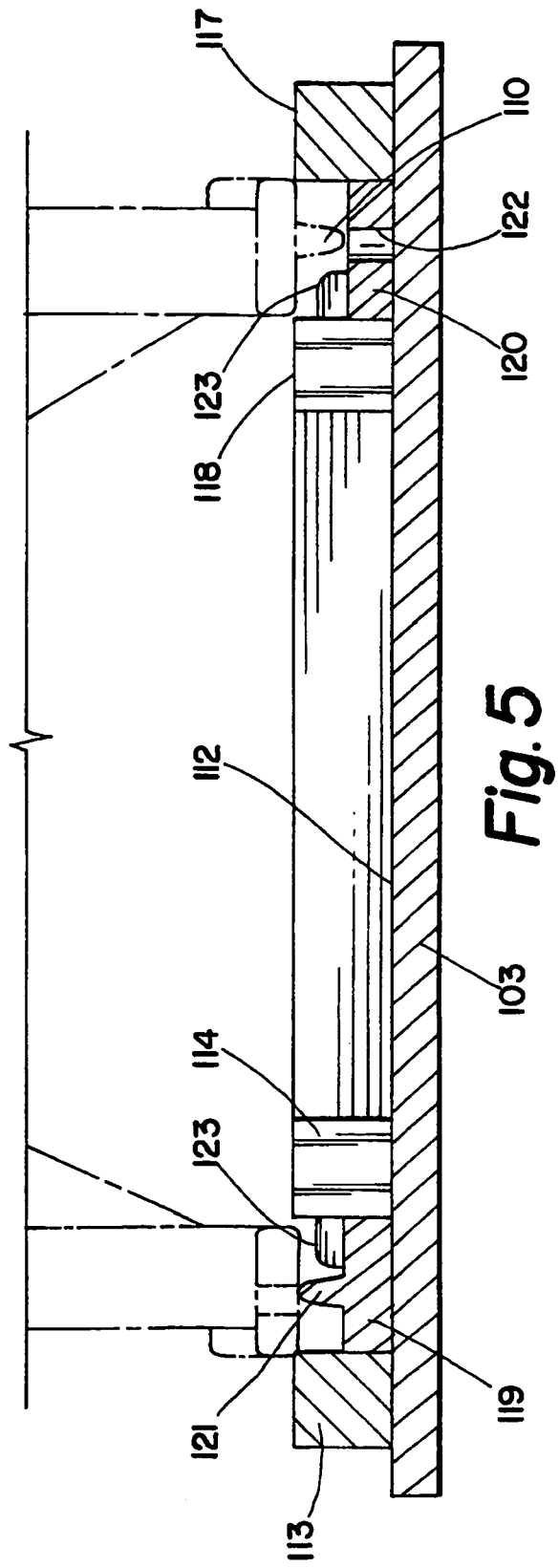

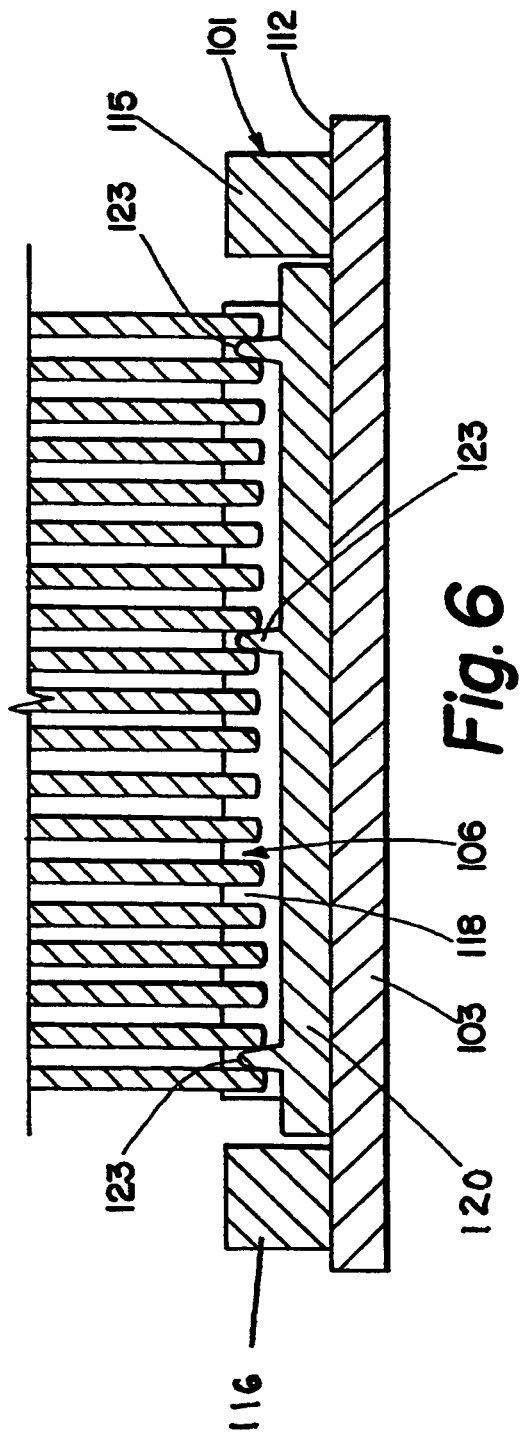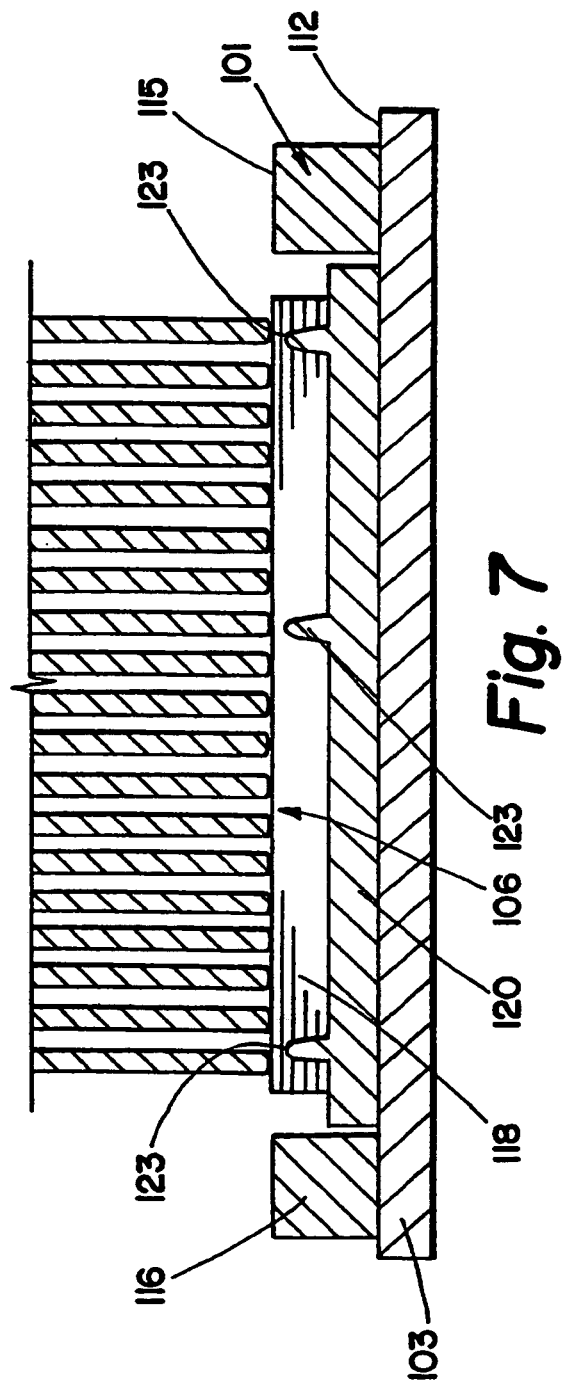

WAFER CARRIER CHECKER AND METHOD OF USING SAME

FIELD OF INVENTION

This invention relates generally to semiconductor manufacturing equipment and more particularly to an apparatus and method for checking the dimensions of a wafer carrier.

BACKGROUND

Wafer or disk carriers are used with semiconductor manufacturing equipment such as wafer handlers to store and transport semiconductor wafers in processes for making semiconductor devices such as integrated circuits. A common design for such wafer carriers stacks a plurality of the wafers in close proximity to each other, with each wafer having its own slot within the carrier. It is important that the wafers be precisely spaced and aligned within the carrier so that when the carrier is in use, the wafer handlers are properly aligned with the individual wafers. Misaligned wafers can result in damage to the tooling, breakage of the wafers or improperly etched wafers.

It can be difficult to determine from a visual inspection whether a carrier is properly dimensioned. Through repeated use, or trauma, a carrier can lose its proper shape. Additionally, new carriers often do not match specifications. As a result, users commonly rely on "known good" carriers that have been used successfully in the past, which can result in moving wafers from loaded carriers that are of unknown quality to known good carriers. Such changing of carriers can increase the contamination of the wafers, and may even result in additional broken wafers.

What is needed is a device to easily and quickly verify whether a disk carrier complies with the desired size and shape specifications. Preferably the device is simple and economical to use and construct.

SUMMARY OF THE INVENTION

According to one embodiment, the present invention provides an apparatus for use with a disk carrier of the type that has spaced-apart first and second side walls with respective first and second end portions spaced apart by a distance and defining an opening having respective slots for receiving and stacking a plurality of semiconductor wafers within the carrier during a semiconductor manufacturing process. The apparatus includes a body that has a first structure for forming a first cavity adapted to confine the first end portion of the carrier on the body and a second structure for forming a second cavity adapted to confine the second end portion of the carrier on the body. The first and second cavities are spaced apart a distance equal to the distance between the first and second end portions of the carrier. The carrier is properly dimensioned when the first and second end portions of the carrier fully seat within the first and second cavities of the body.

According to another embodiment, the present invention provides an apparatus for determining whether a size and shape of a portion of a disk carrier used in a semiconductor manufacturing process is properly dimensioned. The apparatus comprises a body provided with a socket having a reciprocal size and shape adapted to receive a portion of a disk carrier. If the portion is properly dimensioned the portion seats fully within the socket and if the portion is not properly dimensioned the portion will not seat fully into the socket.

According to yet another embodiment, the invention provides a method of assessing a portion of a disk carrier. An apparatus is provided that has at least one cavity of a desired size and shape to receive the portion of the disk carrier. An attempt is made to insert a portion of the disk carrier into the cavity, and then a determination is made as to whether the disk carrier conforms to the desired configuration depending on whether the portion fits into the cavity.

BRIEF DESCRIPTION OF THE DRAWINGS

FIG. 3 is a top plan view of the disk carrier checker of FIG. 1.

FIG. 4 is a cross-sectional view of the disk carrier checker of FIG. 1 taken along the line 4—4 of FIG. 3, showing in phantom lines a portion of a conforming disk carrier fully seated within the checker.

FIG. 5 is a cross-section view of the disk carrier checker of FIG. 1 taken along line 4—4 of FIG. 3, showing in phantom lines a portion of a nonconforming disk carrier that will not fully seat within the checker.

FIG. 6 is a cross sectional view of the disk carrier checker of FIG. 1 taken along the line 6—6 of FIG. 4 showing a portion of a conforming disk carrier with the disk slot alignment protrusions registering with corresponding disk slots of the conforming disk carrier.

FIG. 7 is a cross sectional view of the disk carrier checker of FIG. 1 taken along the line 6—6 of FIG. 4 showing a portion of a nonconforming disk carrier with the disk slot alignment protrusions interfering with corresponding disk slots of the nonconforming disk carrier.

DETAILED DESCRIPTION OF PREFERRED EMBODIMENTS

Figure 1:
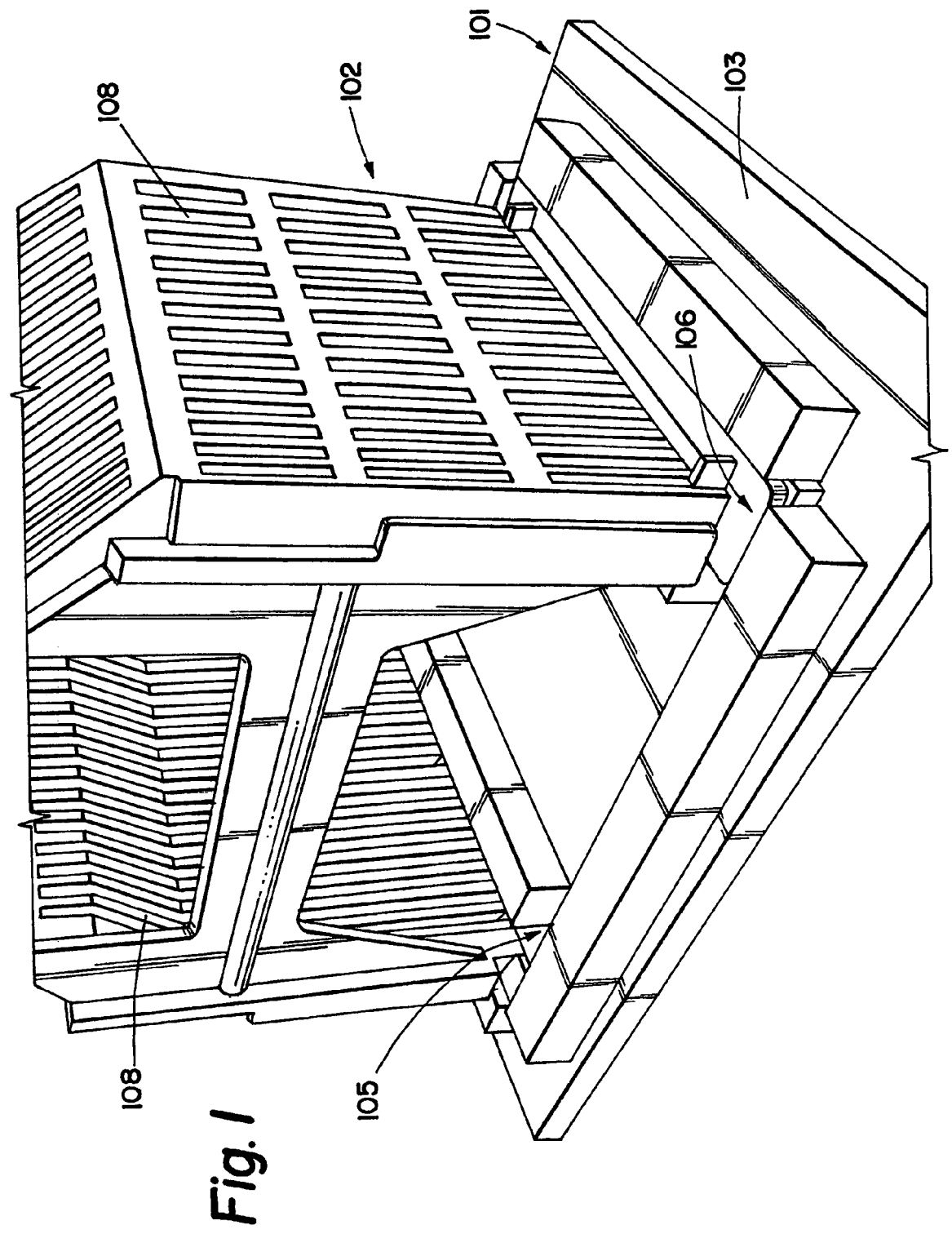
FIG. 1 is a perspective view showing a disk carrier checker according to the present invention with a disk carrier mounted thereon.

Apparatus or disk carrier checker 101 of the present invention is used to determine whether a disk carrier 102 conforms to a desired size and shape. As seen in FIG. 1, according to one embodiment of the present invention, the disk carrier checker 101 has a generally flat base 103 that includes a socket into which a carrier 102 that conforms to the desired size and shape will seat flatly. Thus, the carrier checker 101 acts as a tool to assess a disk carrier 102, or at least a portion of the disk carrier 102, for compliance with a specified size and shape. Disk carriers 102 that conform to the desired shape and size are identified as "good" or "conforming" disk carriers 102. Disk carriers 102 that do not conform to the desired shape and size are identified as "bad" or "nonconforming" disk carriers 102. The features and operation of the checker 101 are described in detail below.

Figure 2:
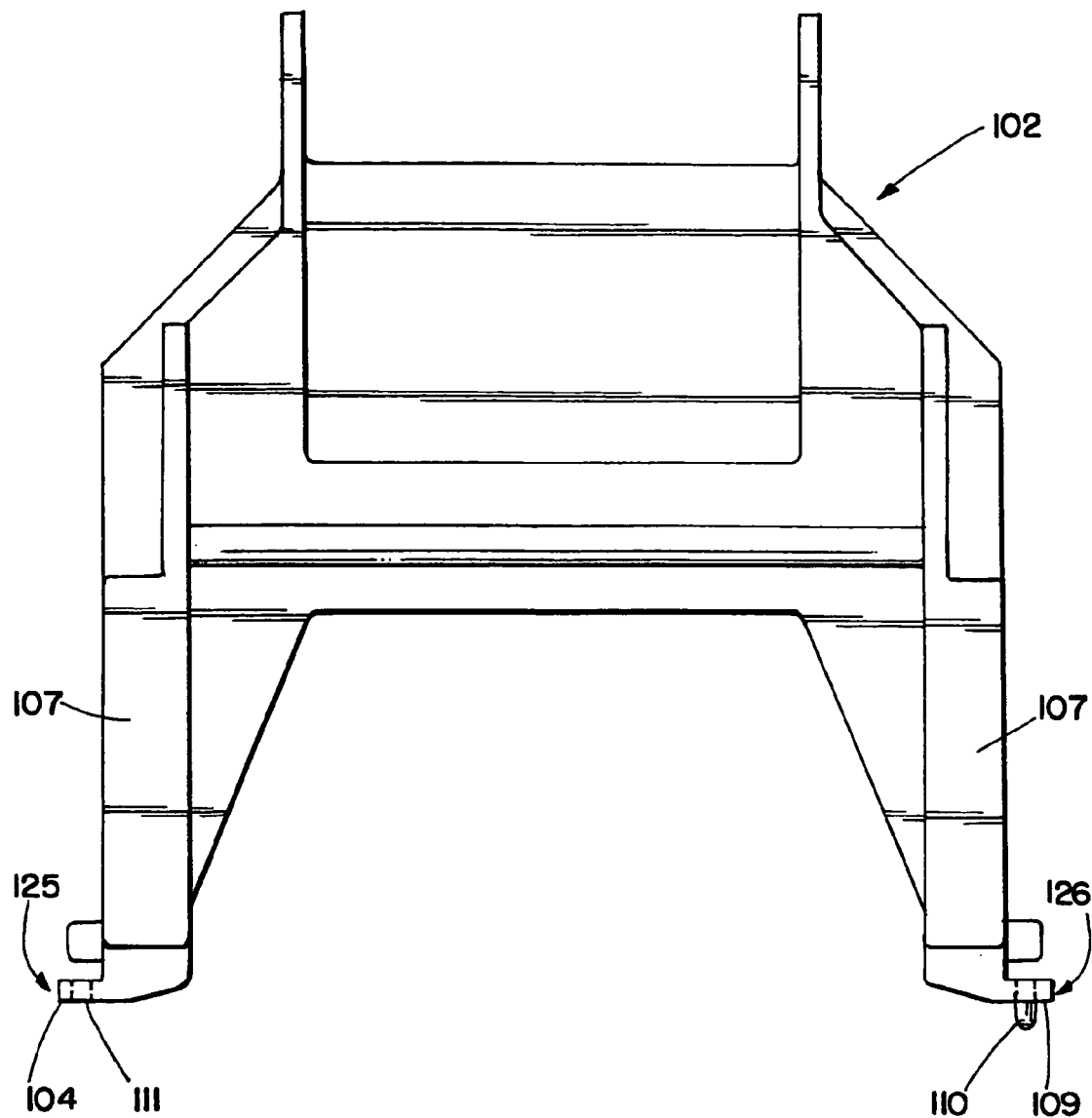
FIG. 2 is a perspective view of the disk carrier of FIG. 1.

The carrier 102 includes facing spaced-apart first and second side walls 107. Parallel first and second slots 108 are formed in the respective first and second side walls 107 to retain disks (not shown) within the carrier 102 in a stacked arrangement. The carrier 102 shown in the drawings is suited to hold about twenty-five (25) disks; however, the exact capacity and design of the carrier 102 is not crucial to the workings of the present invention. As shown in FIG. 2, the first and second end portions 125 and 126 of the first and second side walls 107 are capped by respective first and second feet 104 and 109. In the embodiment shown, each foot 104 and 109 is a generally flat plate that is substantially perpendicular to the respective side wall 107 to which it is affixed. The feet 104 and 109 may include a pin 110 or similar projecting structure protruding from their bottom surface. Similarly, an aperture 111, or other opening, bore or passageway, may be provided on one or more of the feet 104 and 109. Pins 110 and apertures 111 are common to such carriers 102 and may be used to align two carriers 102 in a facing relation to transfer disks between the two carriers 102.

One preferred embodiment of the apparatus or checker 101 includes a base 103 having an upper surface 112, as illustrated in FIGS. 1 and 3. Cavities or pockets 105 and 106 provided on the upper surface 112 have a reciprocal shape that corresponds with a desired shape and size for the feet 104 and 109 of the carrier 102. The pockets 105 and 106 can be formed, as shown in FIG. 3, by facing surfaces or walls or rails, or similar members, mounted to the upper surface 112 of the base 103. For example, the first pocket 105 can be formed by a first outer side rail 113, a first inner side rail 114, a top rail 115 and a bottom rail 116. Similarly, the second pocket 106 can be formed by facing surfaces of a second outer side rail 117, a second inner side rail 118, the top rail 115, and the bottom rail 116. A first seating pad 119 and a second seating pad 120 may be provided on surface 112 of base 103 to form the bottom surfaces of the pockets.

The base 103 is a relatively rigid substrate with a generally flat upper surface 112. Preferably the base 103 is durable and difficult to deform, so that it retains its shape. Preferred materials for the base include a sheet of hard plastic, metal, or composite material. The overall outer shape of the base 103 is not critical; however, it is preferred to leave some amount of border around the rails 113, 115, 116, and 117 in order to facilitate handling of the tool 101. Preferably the base 103 will be relatively resistant to expansion and contraction in response to temperature changes.

The rails 113, 114, 115, 116, 117, and 118 are elongated bars that have side surfaces that extend perpendicularly from the upper surface 112 of the base 103 to form the pockets 105 and 106. The overall cross-section of the rails are not critical, provided that the side surfaces that form the pockets 105 and 106 are generally perpendicular to the upper surface 112 of the base 103. Elongated bars with a rectangular cross-section are preferred because they are easy to work with. It should be appreciated that each rail 113, 114, 115, 116, 117, and 118 could include more than one segment or piece of material. The rails 113, 114, 115, 116, 117, and 118 are also preferably made from a rigid durable material such as hard plastic, metal, or composite material. Those of skill in the art will be aware of numerous suitable materials. The rails 113, 114, 115, 116, 117, and 118 are fixed to the upper surface 112 of the base 103 by any suitable means such as bolts or other fasteners (not shown) through the bottom of the base 103 that extend into the rails. Other standard fastening mechanisms such as adhesives, welding, screws and the like would also be suitable. Alternatively, the entire structure of the checker 101, including the base 103 and the rails 113, 114, 115, 116, 117, and 118, can be injection molded or otherwise formed as a single unitary piece.

Seating pads 119 and 120 provide a flat bottom surface for the pockets 105 and 106 respectively. In the embodiment shown, the first seating pad 119 is provided with a pair of alignment protrusions 121 for mating engagement with alignment apertures 111 on the first foot 104. In some instances it may be preferable to omit the alignment protrusions 121, because they can make seating of the foot 104 in pocket 105 more cumbersome. The second seating pad 120 is provided with a pair of alignment passages or bores 122 for mating engagement with the alignment pins 110 on the second foot 109. The seating pads 119 and 120 are similar in form to the rails, but have a lower profile and can have any suitable cross-sectional shape. The top surfaces of the seating pads 119 and 120 are preferably flat, to provide a resting surface for the substantially planar bottom of the feet 104 and 109. It is appreciated that the top surfaces of the seating pad can be contoured to conform to the bottom of feet 104 and 109 where the bottom of the feet is not planar.

Slot alignment protrusions 123 are provided in the pockets 105 and 106 to engage slots 108 of the carrier 102. The slot alignment protrusions 123 are provided at the junctions of the inner side rails 114 and 118 and the seating pads 119 and 120. The slot alignment protrusions 123 may be formed as part of the pads 119 and 120 or as part of the inner side rails 114 and 118. Alternatively, the slot alignment protrusions 123 may be separate pieces that are fastened to either or both of the inner side rail and the seating pad. Though not required, the slot alignment protrusions 123 are provided in pairs such that in each pair of slot alignment protrusions 123 engages with or extends into corresponding ends of the associated slot 108. It should be understood that a single slot 108 may in fact be formed by two corresponding facing pockets formed in the first and second sidewalls 107. For example a first pair of slot alignment protrusions 123 engages with corresponding ends of the first slot, a second pair of slot alignment protrusions 123 engages with the fifteenth slot, and a third pair of slot alignment protrusions 123 engages with the twenty-fifth slot. The slot alignment protrusions 123 are sized to a close tolerance with the slots 108, that is the protrusions have a transverse dimension that closely approximates the width of the slots, so that that slot alignment protrusions 123 will interfere with seating of the feet 104 or 109 within the pockets 105 and 106 if the protrusion 123 is not closely aligned with its corresponding slot 108.

FIG. 4 shows the first and second pockets 105 and 106 in cross-section. The position of a carrier 102 that conforms to the desired dimensions is illustrated in phantom lines. As can be seen, the width of the pockets 105 and 106 closely matches the width of the feet 104 and 109 so that if the feet 104 and 109 do not closely match the desired specifications, and as such are not properly dimensioned, the feet 104 and 109 will not slide easily into the pockets 105 and 106. In the circumstance of a conforming carrier 102, as illustrated in FIG. 4, the bottoms of the feet 104 and 109 seat flush against the top surface of the seating pads 119 and 120. The alignment protrusion 121 in first pocket 105 is matingly received into the alignment aperture 111 in the first foot 104. Similarly, the alignment passage 122 in the seating pad 120 of the second pocket 106 matingly receives the alignment pin 110 of the second foot 109.

FIG. 5 is the same view as FIG. 4, except that a nonconforming carrier 102 is shown in phantom lines. In the instance of a non-conforming carrier 102, the feet 104 and 109 do not seat flat or flush against the pads 119 and 120. The interference that prevents the feet 104 and 109 from completely seating can result from one or more of the rails 113, 114, 115, 116, 117, or 118, the alignment protrusion 121, the alignment passage 122, or the slot alignment protrusions 123 engaging the improperly dimensioned carrier 102 and thus precluding flush seating of the feet 104 and 109 with respective pads 119 and 120 within respective pockets 105 and 106.

FIGS. 6 and 7 show the slot alignment protrusions 123 in cross-section. In FIG. 6, a portion of a conforming carrier 102 is shown in cross section in phantom lines. The slot alignment protrusions 123 each engage a corresponding slot 108 in the carrier 102. Because the slot alignment protrusions 123 are squarely aligned or properly registered with their corresponding slots 108, the foot 109 can seat flushly against the seating pad 119. A portion of a nonconforming carrier is shown in cross section in phantom lines in FIG. 7. In the case of this nonconforming carrier 102, the slot alignment protrusions 123 are not squarely or fully aligned or properly registered with their respective slots 108. The slot alignment protrusions 123 thus interfere with the carrier 102 and prevent the carrier 102 from seating flush within the pocket 106.

It should be appreciated that the embodiment described thus far could be modified in order to accommodate carriers 102 of various designs. For instance the pockets 105 and 106 can be formed in virtually any shape and size by varying the characteristics of the rails used to form the pockets 105 and 106. The number and placement of the alignment protrusions 121, alignment passages 122, and slot alignment protrusions 123 within pockets 105 and 106 can be modified to be reciprocal with the desired specifications of the carrier 102, for example cooperatively mate with corresponding features of the carrier. It should be appreciated that rather than using a single top rail 115 and a single bottom rail 116 that span both pockets 105 and 106, separate rails could be used for each pocket. Furthermore, it is not necessary to include all of the alignment aids, that is pockets, alignment protrusions, alignment passages and slot alignment protrusions, in order to successfully utilize the checker 101. Various combinations of the alignment aids may be sufficient to create a viable checker 101 according to the present invention.

In operation and use, the carrier checker 101 acts as a tool to assess a disk carrier 102, or at least a portion of the disk carrier 102, for compliance with a specified size and shape. Disk carriers 102 that conform to the desired shape and size can be identified as "good" or "conforming" disk carriers 102. Disk carriers 102 that do not conform to the desired shape and size can be identified as "bad" or "nonconforming" disk carriers 102.

In order to assess whether a particular disk carrier 102 is a good or bad carrier, a user attempts to seat the feet 104 and 109 of the carrier 102 into their corresponding pockets 105 and 106. If the feet 104 and 109 easily seat fully within the pockets 105 and 106, then the carrier 102 is properly dimensioned and can be identified as a good carrier. If, on the other hand, the carrier 102 do not fully seat within the pockets 105 and 106, then the carrier 102 is not properly dimensioned and can be identified as a bad carrier 102.

Figure 8:
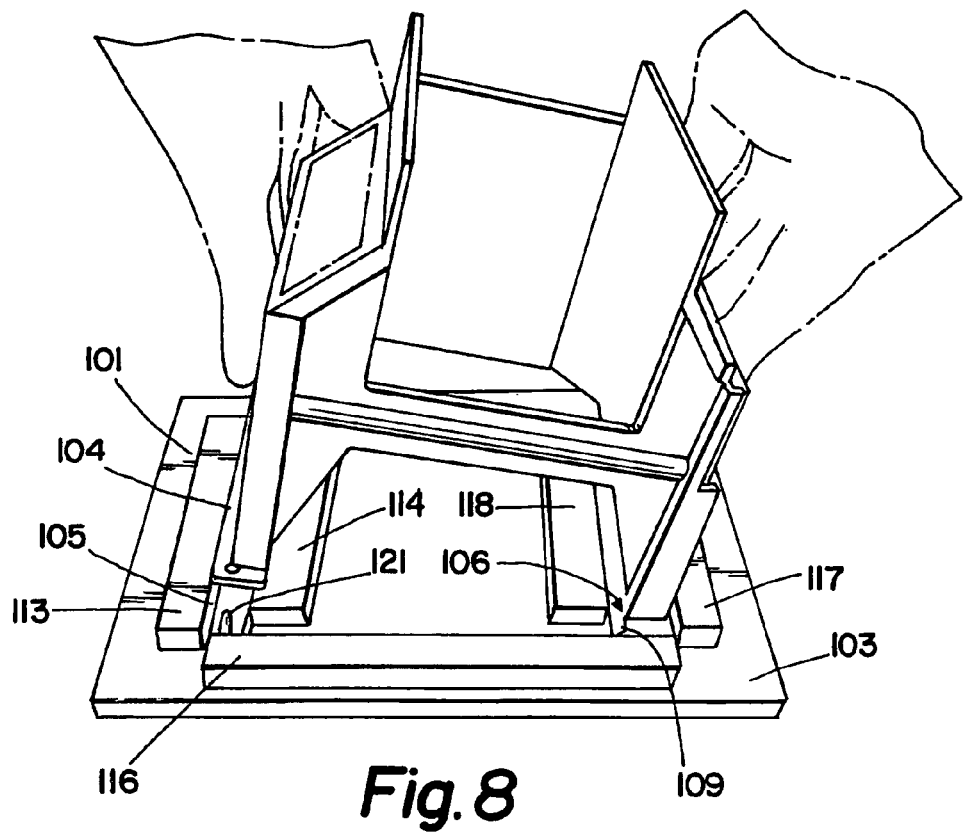
FIG. 8 is a perspective view showing the disk carrier of FIG. 1 being inserted into the disk carrier checker of FIG. 1 to determine if the disk carrier is properly dimensioned.
Figure 9:
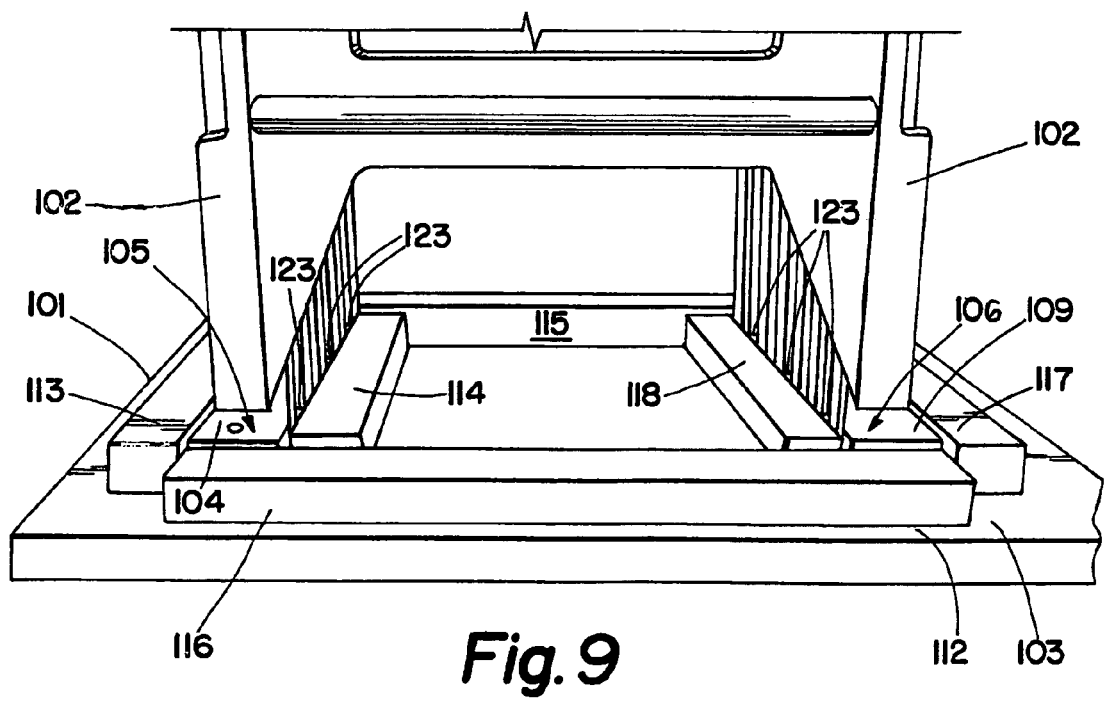
FIG. 9 is a partial perspective view of the disk carrier and disk carrier checker of FIG. 1 after the disk carrier has been fully inserted into the disk carrier checker, for example in accordance with FIG. 8.

FIG. 8 illustrates one manner of attempting to seat the carrier feet 104 and 109 within the pockets 105 and 106. The carrier 102 is tilted so that the first foot 104 is elevated relative to the second foot 109. The second foot 109 is inserted into the second pocket 106. The carrier 102 is then released so that the first foot 104 is allowed to fall into the first pocket 105 to the position shown in FIG. 9. If both feet 104 and 109 seat fully within their respective pockets 105 and 106 under the force of gravity without the need to force them into place, then the carrier 102 is a good carrier. If on the other hand, either, or both, of the feet 104 and 109 do not seat fully within their respective pockets 105 and 106, then the carrier 102 is identified as a bad carrier.

Figure 10:
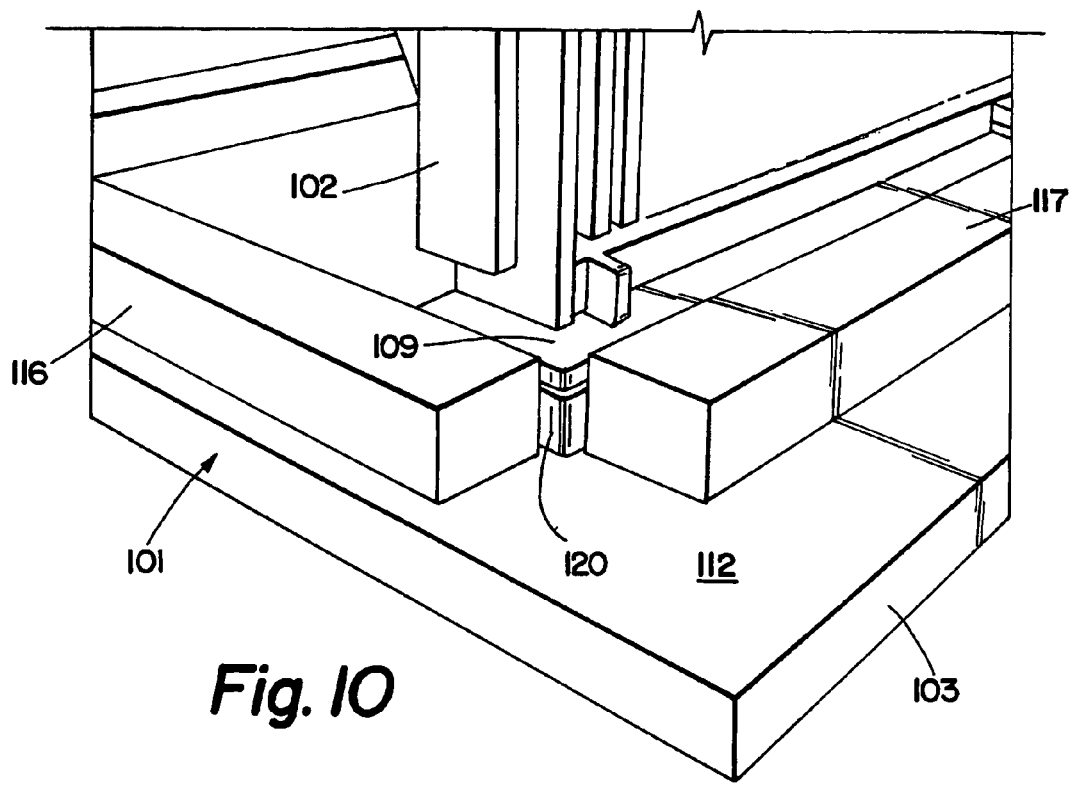
FIG. 10 is an enlarged partial perspective view showing the disk carrier checker and disk carrier of FIG. 1, where the disk carrier is a conforming disk carrier fully seated in the checker, for example in accordance with FIG. 8.

FIG. 10 shows a detailed view of the appearance of a corner of a good carrier 102 that is fully seated within the second pocket 106. The foot 109 sits flat against the seating pad 120. While not visible in FIG. 10, it should be appreciated that when the good carrier 102 of FIG. 10 is fully seated in the second pocket 106, the alignment pin 110 is received within the alignment passage 122 in the seating pad 120, and the alignment protrusion 121 on the first seating pad 119 is received within the alignment aperture 111 on the first foot 104 (see FIG. 4). The slot alignment protrusions 123 are in engagement with their respective slots 108 (see FIG. 6), when the good carrier 102 is fully seated.

Figure 11:
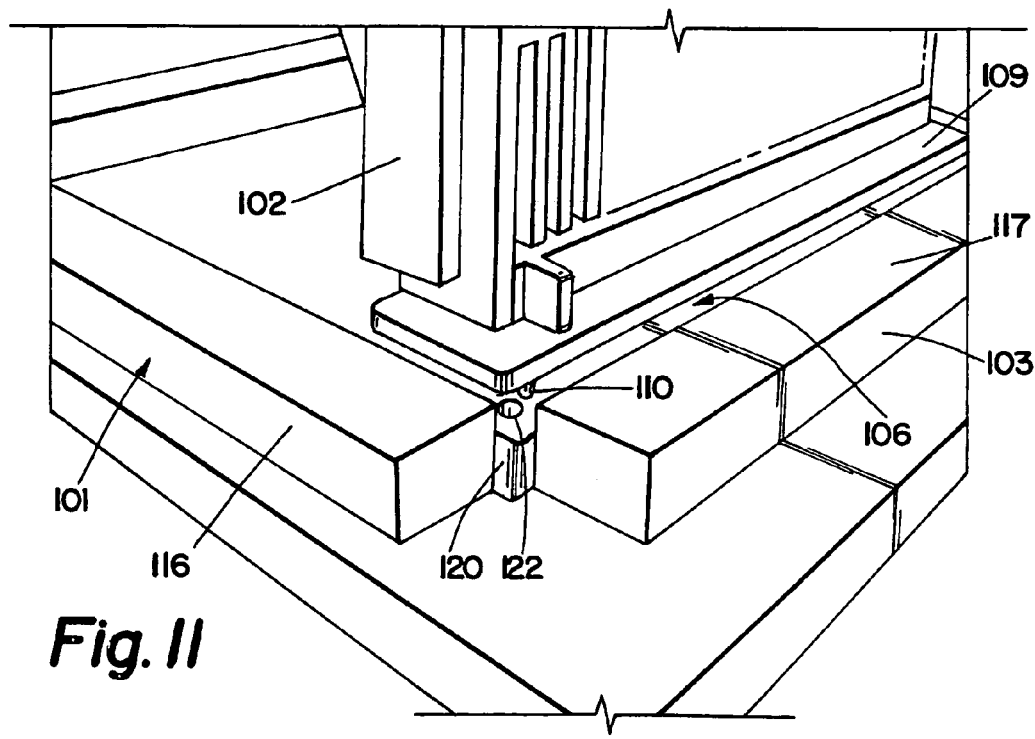
FIG. 11 is an enlarged partial perspective view showing the disk carrier checker and disk carrier of FIG. 1, where the disk carrier is a nonconforming disk carrier that is not fully seated in the checker, for example in accordance with FIG. 8.

FIG. 11 shows a detailed view of a portion of a bad carrier 102 that does not seat fully within the second pocket 106 in that at least one of the alignment elements, that is rails, alignment protrusion, alignment passage, or slot alignment protrusion, interferes with its corresponding feature on the carrier 102. As a result, the carrier 102 is prevented from fully seating in the pocket 106.

The above described embodiments of the invention thus provide a tool and method for quickly and easily assessing whether a disk carrier 102 conforms to a desired size and shape.

Although the present invention has been described with a certain degree of particularity, it is understood that the disclosure has been made by way of example, and changes in detail or structure may be made without departing from the spirit of the invention as defined in the appended claims. For example, the location and number of alignment protrusions 121 and alignment passages 122 can be varied in other embodiments to match the characteristics of a different disk carrier 102.

I claim:

1. An apparatus for use with a disk carrier provided with spaced-apart first and second side walls with respective first and second end portions spaced apart by a distance and defining an opening and having respective slots for receiving and stacking a plurality of semiconductor wafers within the disk carrier during a semiconductor manufacturing process, the apparatus comprising a body having a first structure for forming a first cavity adapted to confine the first end portion of the disk carrier on the body and having a second structure for forming a second cavity adapted to confine the second end portion of the carrier on the body, the first and second cavities being spaced apart a distance equal to the distance between the first and second end portions of the carrier whereby the carrier is properly dimensioned when the first and second end portions of the carrier fully seat within the first and second cavities of the body.

2. The apparatus of claim 1 wherein the body is provided with first and second protrusions extending respectively into the first and second cavities for registering with one of the slots of the respective first and second side walls of the disk carrier so as to align the disk carrier with respect to the body.

3. The apparatus of claim 2 wherein the body is provided with additional first and second protrusions extending respectively into the first and second cavities for registering with another of the slots of the respective first and second side walls of the disk carrier.

4. The apparatus of claim 1 wherein the body includes a base and wherein each of the first and second structures includes first and second spaced-apart side walls extending upwardly from the base for forming the respective first and second cavities.

5. The apparatus of claim 4 wherein the body further includes a third side wall for forming a portion of both the first and second cavities.

6. The apparatus of claim 5 wherein the body further includes a fourth side wall spaced apart from and facing the third side wall for forming a portion of both the first and second cavities.

7. The apparatus of claim 4 wherein the each of the first and second structures includes a pad mounted on the base within the respective first and second cavities and providing a surface on which the respective end portions can seat.

8. The apparatus of claim 1 wherein at least one of said first and second structures is provided with an aperture for mating engagement with a protrusion on the corresponding first or second end portion.

9. The apparatus of claim 1 further comprising an alignment protrusion within one of said first and second cavities for mating engagement with an aperture in the corresponding end portion.

10. An apparatus for determining whether a size and shape of a portion of a disk carrier used in a semiconductor manufacturing process is properly dimensioned, the apparatus comprising a body provided with a socket having a reciprocal size and shape adapted to receive the portion of the disk carrier such that if the portion is properly dimensioned the portion seats fully within the socket and if the portion is not properly dimensioned the portion will not seat fully into the socket, the body being provided with a pair of protrusions extending into the socket for registering with a slot on the disk carrier so as to align the disk carrier with respect to the body.

11. The apparatus of claim 10 wherein the body comprises a base having a flat surface, and walls that extend generally perpendicularly from the flat surface for forming the socket.

12. The apparatus of claim 11 wherein the walls include rails mounted on the flat surface and having side surfaces.

13. An apparatus for determining whether a size and shape of a portion of a disk carrier used in a semiconductor manufacturing process is properly dimensioned, the apparatus comprising a body provided with a socket having a reciprocal size and shape adapted to receive the portion of the disk carrier such that if the portion is properly dimensioned the portion seats fully within the socket and if the portion is not properly dimensioned the portion will not seat fully into the socket, the body including a base provided with a flat surface and the socket including a first pocket portion bounded by facing side surfaces of a first pair of spaced-apart rails mounted to the flat surface and a second pocket portion spaced-apart from the first pocket portion and bounded by facing side surfaces of a second pair of spaced-apart rails mounted to the flat surface.

14. The apparatus of claim 13 wherein the first and second pocket portions have respective widths, further comprising a third pair of spaced-apart rails mounted to the top surface, the third pair of rails including facing surfaces that span the widths of the first and second pocket portions.

15. The apparatus of claim 13 further comprising a first seating pad mounted on the top surface within the first pocket portion and a second seating pad mounted on the top surface within the second pocket portion; the seating pads providing surfaces on which the portion will rest when the portion seats fully within the socket.

16. A method of assessing a portion of a disk carrier that includes first and second side walls with respective first and second end portions, comprising:
providing an apparatus having first and second cavities of a desired size and shape to receive the first and second end portions of the disk carrier;
attempting to insert the first end portion of the disk carrier in the first cavity and thereafter attempting to insert the second end portion of the disk carrier in the second cavity; and
identifying the disk carrier as a good disk carrier if the first end portion of the disk carrier fully seats in the first cavity and the second end portion of the disk carrier fully seats in the second cavity.

17. The method of claim 16 wherein the attempting step includes placing the first end portion in the first cavity and dropping the second end portion towards the second cavity and wherein the identifying step includes identifying the disk carrier as a good disk carrier if the second end portion falls fully into the second cavity.

18. The method of claim 16 wherein at least one of the first and second end portions includes a protrusion and wherein the apparatus is provided with an aperture within at least one the first and second cavities, and wherein the method further comprises attempting to place the protrusion in mated engagement with the aperture.

19. The method of claim 16 wherein at least one of the first and second end portions includes a passage and wherein the apparatus includes an alignment member extending into at least one of the first and second cavities, and wherein the method further comprises attempting to place the passage in mated engagement with the alignment member.

20. The method of claim 16 for use with a disk carrier having a first disk retaining slot provided with opposite ends, wherein the apparatus is provided with a pair of first and second alignment protrusions extending into the first and second cavities for engaging the opposite ends of the first disk retaining slot.

21. The method of claim 20 for use with a disk carrier having a second disk retaining slot provided with opposite ends and a third disk retaining slot provided with opposite ends, wherein the apparatus includes a second pair of first and second alignment protrusions extending into the first and second cavities for engaging the opposite ends of the second disk retaining slot and a third pair of first and second alignment protrusions extending into the first and second cavities for engaging the opposite ends of the third disk retaining slot.

* * * * *